United States Patent
Bindseil et al.

(10) Patent No.: US 11,243,283 B1
(45) Date of Patent: Feb. 8, 2022

(54) SYSTEM AND METHOD TO IMPROVE PERFORMANCE OF ASYMMETRICAL GRADIENT COILS BY ALLOWING A UNIFORM OFFSET FIELD

(71) Applicant: Synaptive Medical Inc., Toronto (CA)

(72) Inventors: Geron Andre Bindseil, Toronto (CA); Blaine Alexander Chronik, Toronto (CA); Ian Robert Oliphant Connell, Toronto (CA); Andrew Thomas Curtis, Toronto (CA); William Bradfield Handler, Toronto (CA); Chad Tyler Harris, Toronto (CA); Jeff Alan Stainsby, Toronto (CA); Philip J. Beatty, Toronto (CA)

(73) Assignee: SYNAPTIVE MEDICAL INC., Toronto (CA)

( * ) Notice: Subject to any disclaimer, the term of this patent is extended or adjusted under 35 U.S.C. 154(b) by 0 days.

(21) Appl. No.: 16/942,412

(22) Filed: Jul. 29, 2020

(51) Int. Cl.
*G01R 33/385* (2006.01)
*G01R 33/38* (2006.01)

(52) U.S. Cl.
CPC ..... *G01R 33/3858* (2013.01); *G01R 33/3802* (2013.01); *G01R 33/3852* (2013.01); *G01R 33/3854* (2013.01)

(58) Field of Classification Search
CPC ............ G01R 33/3858; G01R 33/3854; G01R 33/3852; G01R 33/3802
See application file for complete search history.

(56) References Cited

U.S. PATENT DOCUMENTS

| 2010/0033186 A1* | 2/2010 | Overweg | G01R 33/481 324/318 |
| 2016/0178718 A1* | 6/2016 | Bindseil | G01R 33/385 324/322 |
| 2019/0056468 A1* | 2/2019 | Connell | G01R 33/3628 |

OTHER PUBLICATIONS

X. F. You, W. H. Yang, T. Song, H. X. Wang and Z. Wang, "Asymmetric Gradient Coil Design by Numerical Approach for MRI Brain Imaging," in IEEE Transactions on Applied Superconductivity, vol. 22, No. 3, pp. 4401904-4401904, Jun. 2012 (Year: 2012).*

E. Smith, F. Freschi, M. Repetto and S. Crozier, "A Method for Reducing Secondary Field Effects in Asymmetric MRI Gradient Coil Design," in IEEE Transactions on Biomedical Engineering, vol. 63, No. 5, pp. 924-932, May 2016 (Year: 2016).*

(Continued)

*Primary Examiner* — Daniel R Miller
(74) *Attorney, Agent, or Firm* — Ridout & Maybee LLP

(57) ABSTRACT

An asymmetric electromagnet system, method, and method of producing an asymmetric electromagnet system, wherein the asymmetric electromagnet system is for generating an imaging magnetic field in an imaging region with an imaging isocentre, the imaging region being asymmetrically positioned within a gradient coil bore inside a magnetic resonance imaging (MRI) system during imaging, the electromagnet assembly comprising: an asymmetric gradient coil configured to generate a gradient field in the asymmetrically positioned imaging region, at least one gradient axis having the gradient field with a constant offset component such that the position at which the gradient field passes through zero is offset with respect to the imaging isocentre of the asymmetrically positioned imaging region.

12 Claims, 8 Drawing Sheets

(56) References Cited

OTHER PUBLICATIONS

Shvartsman, S., et al. "Discrete Design of an Insert Gradient Coil for Head Imaging in High Field MRI". ISMRM 14, #1371 2006.
Tomasi, D., et al. "Asymmetrical Gradient Coil for Head Imaging". MRM 48:707-714 2002.
Handler, W.B., et al. "New head gradient coil design and construction techniques". JMRI 39(5):1088-1095. 2014.
Vegh, V., et al. "Toward designing asymmetric head gradient coils for high-resolution imaging". Concepts Magn Reson B 31B(1):1-11 2007.
While, P.T., et al. "Minimizing Hot Spot Temperature in Asymmetric Gradient Coil Design" IEEE Transactions on Biomedical Engineering 58(8):2418-2425 2011.
Wang, Y., et al. "Asymmetric gradient coil design for use in a short, open bore magnetic resonance imaging scanner" JMR 269:203-212 2016.
Tang, F., et al. "An improved asymmetric gradient coil design for high-resolution MRI head imaging". Physics in Medicine and Biology 61 (24):8875-8889 2016.
Alsop, D.C. and Connick, T.J. "Optimization of Torque-Balanced Asymmetric Head Gradient Coils". MRM 35:875-886 1996.
Chronik, B.A., et al. "Design and fabrication of a three-axis edge ROU head and neck gradient coil". MRM 44(6):955-963 2000.
Harris, C.T., et al. "Electromagnet design allowing explicit and simultaneous control of minimum wire spacing and field uniformity". Concepts in Magn Reson B 41B(4):120-129 2012.
Crozier, S., et al."The Design of Transverse Gradient Coils of Restricted Length by Simulated Annealing". Journal of Magnetic Resonance, Series A 107(1):126-128 1994.
Poole, M. and Bowtell R. "Novel Gradient Coils Designed Using a Boundary Element Method". Concepts Magn Reson B 31B(3):162-175. **p. 172 2007.

* cited by examiner zero offset coil offset coil

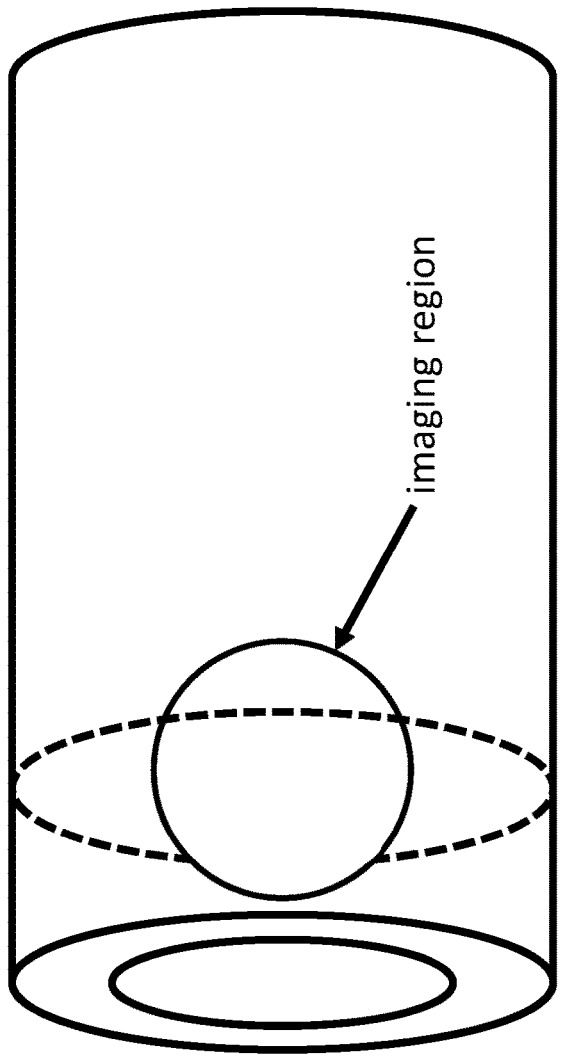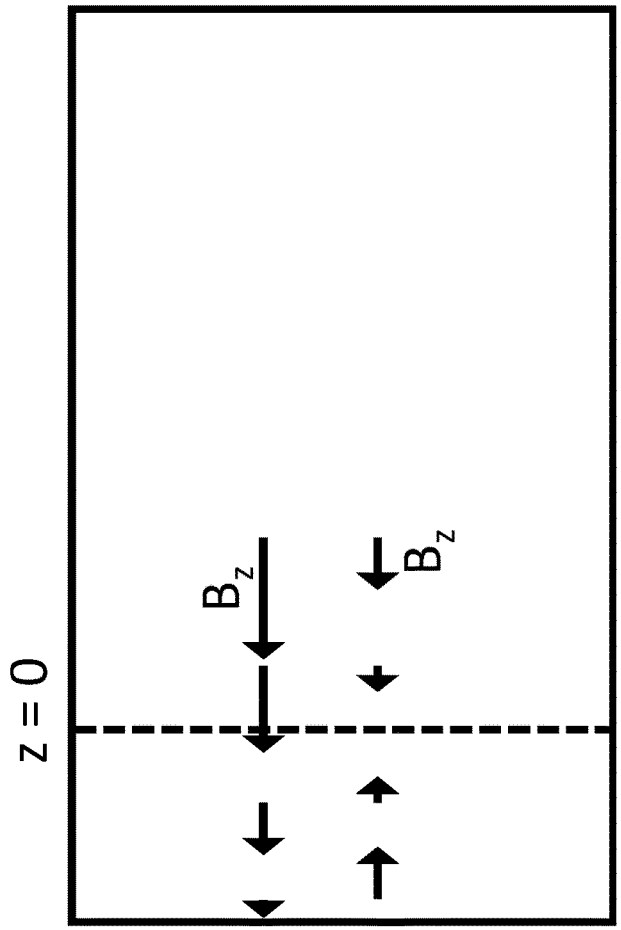
Figure 4
Figure 5

SYSTEM AND METHOD TO IMPROVE PERFORMANCE OF ASYMMETRICAL GRADIENT COILS BY ALLOWING A UNIFORM OFFSET FIELD

FIELD

The present disclosure is related to systems and methods for magnetic resonance. More particularly, the disclosure relates to systems and methods for improving performance of asymmetrical gradient coils.

BACKGROUND

Magnetic resonance imaging (MRI) is generally performed with very strong static magnetic fields. The static magnetic field, also referred to as the "main field" or "B0 field", is responsible for polarizing nuclei and is required for imaging during nuclear magnetic resonance.

The gradient coils of an MRI system create magnetic fields that vary spatially in a linear way with respect to each orthogonal spatial axis (i.e. x-, y-, and z-axes). In the ideal case, the linearly varying magnetic fields produced by the gradient coils are zero at the "isocentre" of the system, that is, at the origin of the spatial axes. However, in certain situations, performance improvements can be achieved if the magnetic fields produced by the gradient coils can have a net offset from the system isocentre. One such instance is with an asymmetric z-gradient coil where the imaging region is offset to be closer to one end of the coil.

Design of such high performance z-gradient coils is extremely difficult when the imaging region is placed asymmetrically with respect to the available gradient coil geometry. This is due to the high-density grouping of windings near one end of the coil in order to maintain a symmetric gradient field (i.e. one that has an isocentre at the same location as the system isocentre of the main magnet). The high-density grouping of windings poses construction problems.

As well, another drawback of allowing the gradient system to have an offset field at the isocentre is that when the gradient coil is pulsed, for spatial encoding, slice selection, shimming, etc., the main magnetic field will shift relative to the amount of current within the gradient coil. The time-varying change in the main magnetic field will have extremely negative consequences on imaging.

Thus, there remains a need to provide systems and methods for reducing or otherwise improving the performance of asymmetrical z-axis gradient coils in magnetic resonance systems.

SUMMARY

An asymmetric electromagnet system for generating an imaging magnetic field in an imaging region with an imaging isocentre, the imaging region being asymmetrically positioned within a gradient coil bore inside a magnetic resonance imaging (MRI) system during imaging, the electromagnet assembly comprising: an asymmetric gradient coil configured to generate a gradient field in the asymmetrically positioned imaging region, at least one gradient axis having the gradient field with a constant offset component such that the position at which the gradient field passes through zero is offset with respect to the imaging isocentre of the asymmetrically positioned imaging region.

In some examples, the present disclosure provides a method for generating an imaging magnetic field in an imaging region with an imaging isocentre, the imaging region being asymmetrically positioned within a gradient coil bore inside a magnetic resonance imaging (MRI) system during imaging, the method comprising: generating a gradient field in the asymmetrically positioned imaging region, at least one gradient axis having the gradient field with a constant offset component whereby the position at which the gradient field passes through zero is offset with respect to the imaging isocentre of the asymmetrically positioned imaging region.

In some examples, the present disclosure provides a method of producing an asymmetric gradient coil for generating an imaging magnetic field in an imaging region with an imaging isocentre, the imaging region being asymmetrically positioned within a gradient coil bore inside a magnetic resonance imaging (MRI) system, the steps of the method comprising:
 (a) forming a coil representation of a coil surface for the asymmetric gradient coil;
 (b) setting a plurality of magnetic field targets for the asymmetric gradient coil, the plurality of field targets including at least one gradient axis having a gradient field with a constant offset component such that the position at which the gradient field passes through zero is offset with respect to the imaging isocentre of the asymmetrically positioned imaging region;
 (c) forming a performance functional, based on the coil representation and the plurality of magnetic field targets, for generating a current density pattern over the coil surface;
 (d) optimizing the performance functional based on the plurality of magnetic field targets;
 (e) generating a current density pattern over the coil surface based on the optimized performance functional; and
 (f) obtaining coil windings from the current density pattern.

The foregoing and other aspects and advantages of the present disclosure will appear from the following description. In the description, reference is made to the accompanying drawings that form a part hereof, and in which there is shown by way of illustration a preferred embodiment. Such embodiment does not necessarily represent the full scope of the disclosure, however, and reference is made therefore to the claims and herein for interpreting the scope of the disclosure.

BRIEF DESCRIPTION OF THE DRAWINGS

Reference will now be made, by way of example, to the accompanying drawings which show example embodiments of the present application, and in which:

FIG. 4 is a schematic of an electromagnet with an asymmetrically positioned imaging region;

FIG. 5 is a schematic illustrating the magnetic field strength along the z-axis generated by the asymmetric gradient coil of FIG. 2 compared to the magnetic field strength along the z-axis generated by the asymmetric gradient coil of FIG. 3;

DETAILED DESCRIPTION

Described herein are systems, devices, and methods for generating an imaging magnetic field in an imaging region with an imaging isocentre, where the imaging region is off-centre or asymmetrically positioned within a gradient coil bore inside a magnetic resonance imaging (MRI) system during imaging.

With typical MRI gradient coils, they cause linear field variations. For example, the Z coil causes positive or negative (+/−) field variations relative to the isocentre of the gradient coils in the z-direction. The x and y coils correspondingly cause +/−field variations relative to the isocentre in the x and y-directions. However, with imaging regions that are not positioned in the middle of the coil, i.e. with asymmetric gradient coils, it becomes difficult to produce a zero field in the middle of the gradient coil bore, or at the isocentre. When the magnetic field is asymmetrical along the z-direction, the imaging region is offset from the middle of the gradient coil bore in the z-direction.

To account for this, the present invention involves designing some offset to the magnetic field, so that the desired gradient is achieved in the asymmetrically positioned imaging region.

Figure 1:
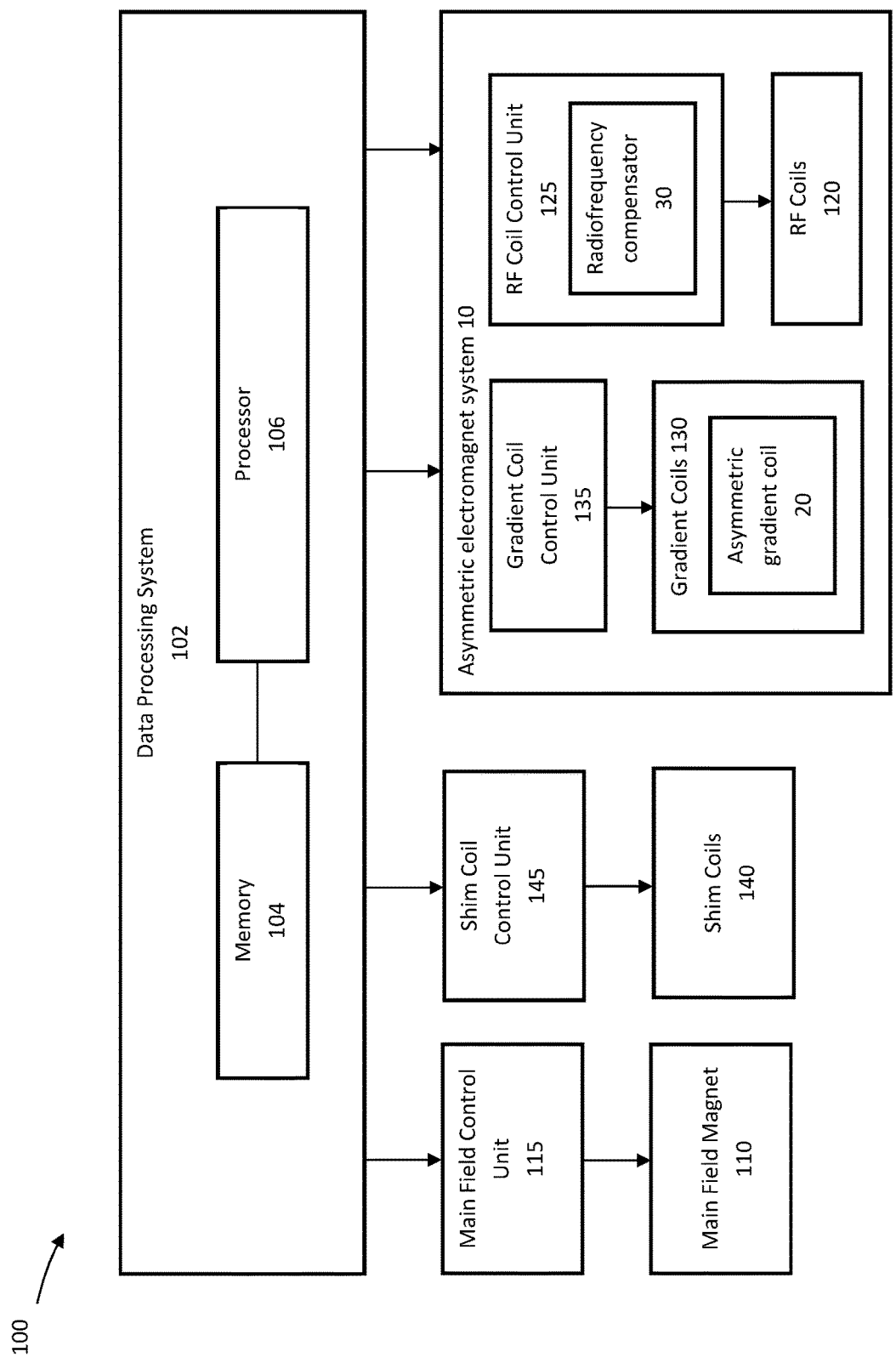
FIG. 1 is a block diagram of an example magnetic resonance imaging (MRI) system with an asymmetric electromagnet system in accordance with an example embodiment of the present disclosure.

Referring to FIG. 1, a block diagram of an example magnetic resonance imaging (MRI) system is shown at 100 in accordance with an example embodiment. The example implementation of MRI system indicated at 100 is for illustrative purposes only, and variations including additional, fewer and/or varied components are possible.

As shown in FIG. 1, the illustrative MRI system 100 comprises a data processing system 102. The data processing system 102 can generally include one or more output devices such as a display, one or more input devices such as a keyboard and a mouse as well as one or more processors connected to a memory having volatile and persistent components. The data processing system 102 may further comprise one or more interfaces adapted for communication and data exchange with the hardware components of MRI system 100 used for performing a scan. As shown, data processing system 102 includes a memory 104 and a processor 106 for controlling the communication and data exchange with the hardware components.

Continuing with FIG. 1, example MRI system 100 also includes a main field magnet 110. The main field magnet 110 may be implemented as a permanent, superconducting or a resistive magnet, for example. Other magnet types, including hybrid magnets suitable for use in MRI system 100 are contemplated. Main field magnet 110 is operable to produce a substantially uniform main magnetic field having strength B0 and a direction along an axis. The main magnetic field is used to create an imaging volume therein within which desired atomic nuclei, such as the protons in hydrogen within water and fat, of an object are magnetically aligned in preparation for a scan. In some implementations, as in this example implementation, a main field control unit 115 in communication with data processing system 102 may be used for controlling the operation of main field magnet 110.

The MRI system 100 further includes radio frequency (RF) coils 120. The RF coils 120 are used to establish an RF magnetic field with strength B1 to excite the atomic nuclei or "spins". The RF coils 120 can also detect signals emitted from the "relaxing" spins within the object being imaged. Accordingly, the RF coils 120 may be in the form of separate transmit and receive coils or a combined transmit and receive coil with a switching mechanism for switching between transmit and receive modes.

The RF coils 120 may be implemented as surface coils, which are typically receive only coils and/or volume coils which can be receive and transmit coils. RF coils 120 can be integrated in the main field magnet 110 bore. Alternatively, RF coils 120 may be implemented in closer proximity to the object to be scanned, such as a head, and can take a shape that approximates the shape of the object, such as a close-fitting helmet. An RF coil control unit 125 in communication with data processing system 102 may be used to control the operation of the RF coils 120 in either a transmit aspect or a receive aspect.

To obtain images from the MRI system 100, one or more sets of RF pulses and gradient waveforms (collectively called "pulse sequences") are selected at the data processing system 102. The data processing system 102 communicates the selected pulse sequence information to the RF control unit 125 and one or more gradient coil systems, discussed in more detail below, which collectively generate the associated waveforms and timings for providing a sequence of pulses to perform a scan.

The gradient coil system includes gradient coils 130, which produce controlled and uniform linear gradients with the main magnetic field. For example, gradient coils 130 may include three orthogonal current-carrying gradient coils, the x gradient coil, the y gradient coil, and the z gradient coil. When there are three orthogonal gradient axes, each gradient coil 130 may be configured to generate a magnetic field that varies linearly along one of the three gradient axes. Along with the main field magnet 110, gradient coils 130 may be designed to produce a desired linear-gradient magnetic field along each x, y, and z axis. Each gradient coil 130 may be used individually or in combination with one another.

In addition to allowing spatial excitation, gradient coils 130 may attach spatially specific frequency and phase information to the atomic nuclei placed within the imaging volume, allowing the resultant MR signal to be reconstructed into a useful image. A gradient coil control unit 135, in communication with data processing system 102, is used to control the operation of gradient coils 130. Generally, the imaging volume may be defined as the region in which MR images of interest are obtained using the MRI apparatus. The imaging volume may be a spherical volume that is smaller than the total volume of space within gradient coils 130.

MRI system 100 includes shim coils 140 and a shim coil control unit 145 in communication with data processing system 102. Shim coil control unit 145 may be used for controlling the operation of shim coils 140.

MRI system 100 further includes an asymmetric electromagnet system 10, which comprises an asymmetric gradient coil 20 and, optionally, a radiofrequency compensator 30. As will be further described below, asymmetric electromagnet system 10 may be considered the device or system that communicates with an RF tuning circuit, which may form part of RF coil control unit 125, and tells it which frequency (adjusted for the gradient offsets) to tune to for a particular slice-selection pulse.

In the present embodiment, one of gradient coils 130 is asymmetric gradient coil 20, which may further be an asymmetric z-gradient coil 22 of MRI system 100. In such a case, the magnetic field is typically asymmetrical positioned along the z-direction and the imaging region is offset from the middle of the gradient coil bore (see FIG. 4 for example). The imaging isocentre would also be positioned at z=0. In other applications, asymmetric gradient coil 20 may instead be an asymmetric x-gradient coil or an asymmetric y-gradient coil.

Figure 2:
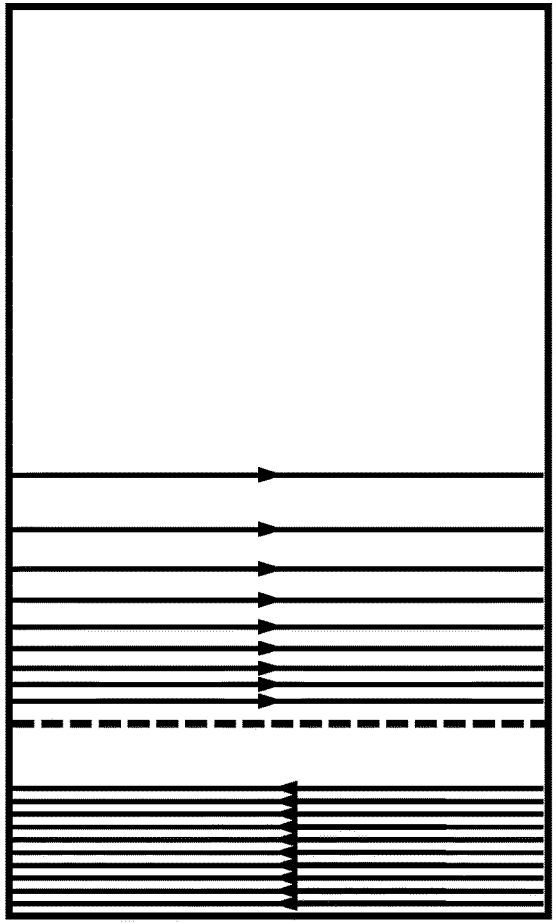
FIG. 2 is a schematic wire pattern of a known asymmetric gradient coil with no offset.

As discussed above, the windings of a typical asymmetric z-gradient coil without an offset must be very close together at the patient end, see FIG. 2 for example. Such a zero offset coil requires a large opposite current density on one side of z=0 to counter the current on other side of z=0.

In this manner, a typical asymmetric z-gradient coil, with zero offset, is configured to generate a gradient field in the asymmetrically positioned imaging region, where the gradient field passing through the its imaging isocentre (i.e. z=0) is generally zero (see FIG. 5 for example). Understandable, there is a practical limit on the efficiency of such a coil, as determined based the amount of field change per amp of current. The zero offset design also requires trade-offs in other components (e.g. shield coil) to achieve the desired efficiency.

Figure 3:
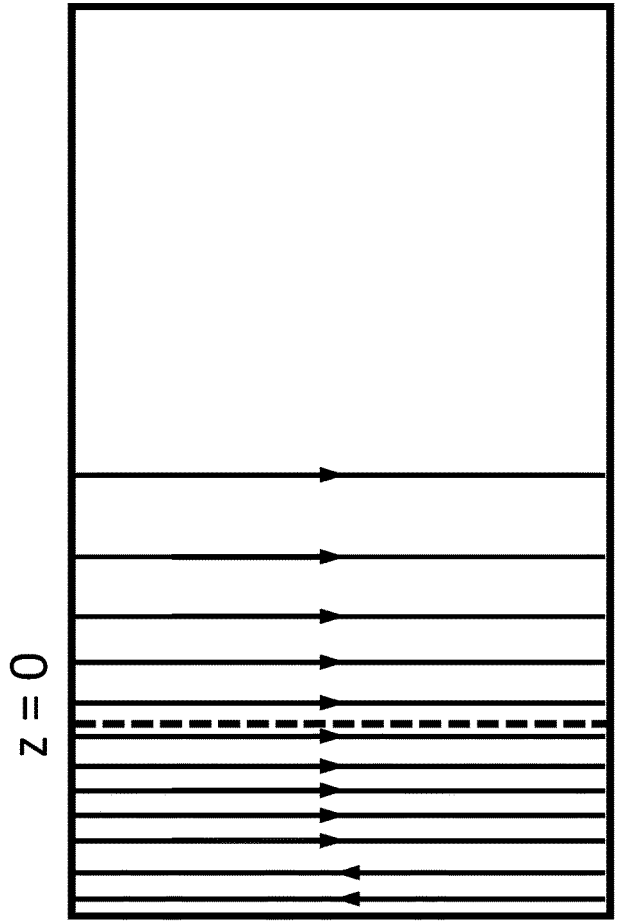
FIG. 3 is a schematic wire pattern of an asymmetric gradient coil of an asymmetric electromagnet system in accordance with an example embodiment of the present disclosure.

Asymmetric z-gradient coil 22 of the present invention, as shown in FIG. 3, has fewer windings and the windings are spaced further apart from one another relative to the winding density of the standard asymmetrical z-gradient coil of FIG. 2. In this manner, asymmetric z-gradient coil 22 is configured to generate a gradient field in the asymmetrically positioned imaging region, where at least one gradient axis has the gradient field with a constant offset component relative to its imaging isocentre. In other words, as also shown in FIG. 5, the position at which the gradient field passes through zero is offset with respect to the imaging isocentre (i.e. z=0) of the offset, or asymmetrically positioned, imaging region.

This offset may be described as having a field offset of a certain amount, such as a 50 mT offset. Another way to describe the offset is based on the position of the zero magnetic field relative to the imaging isocentre, or z=0. For example, if the coil produces zero magnetic field 10 cm from the imaging isocentre, the magnetic gradient field is offset or shifted by 10 cm from the imaging isocentre. In the present embodiment, the gradient field may be generally offset from the imaging isocentre between 5 cm and 20 cm, and preferably between 7 cm and 15 cm.

Figure 6:
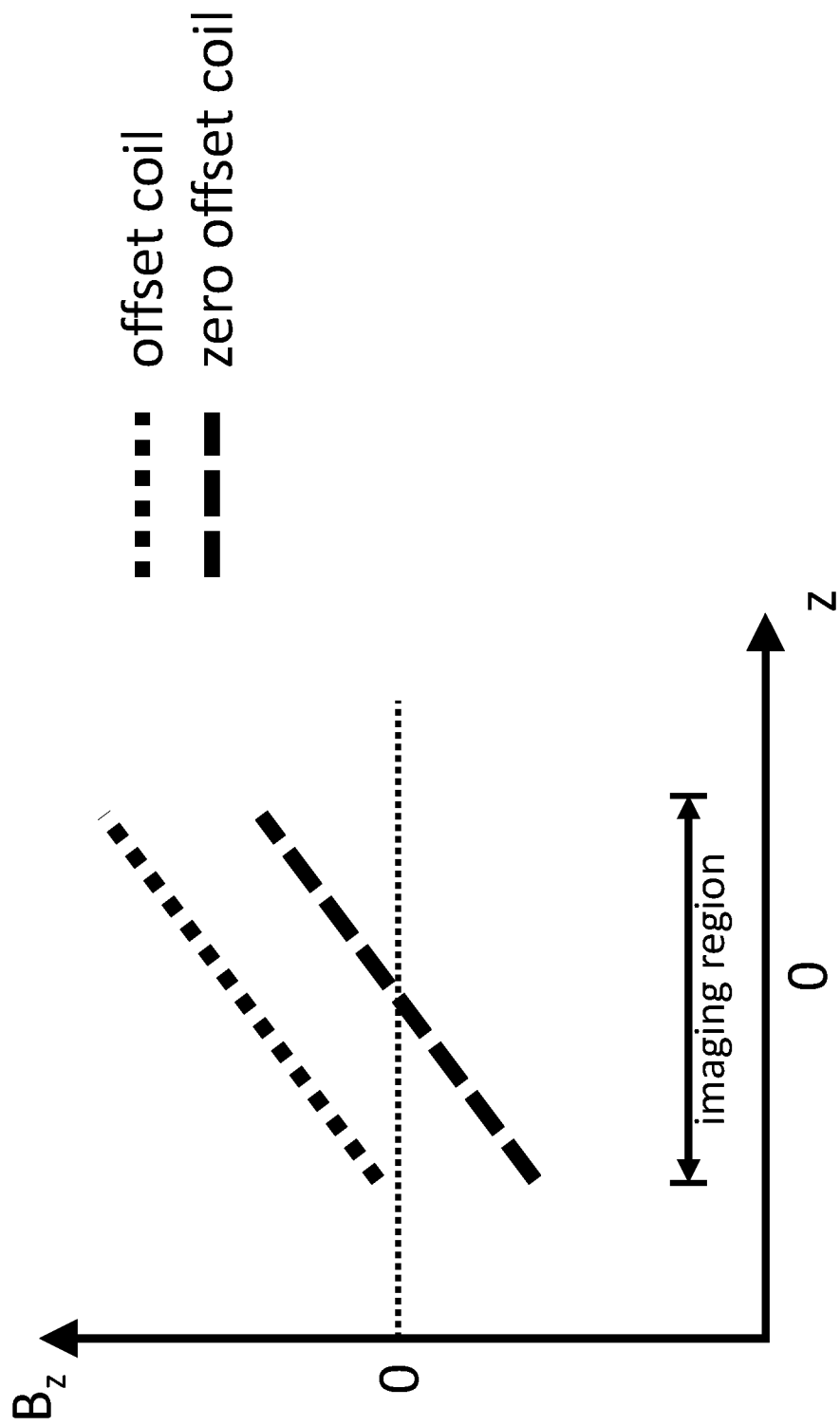
FIG. 6 is a graph comparing the magnetic field along the z-axis generated by the asymmetric gradient coil of FIG. 2 compared to the magnetic field along the z-axis generated by the asymmetric gradient coil of FIG. 3.

As shown in FIG. 6, since the magnetic field doesn't go through zero, the magnetic field may be either positive or negative (+ or −). If the current is flowing in the opposite direction, the field would be flipped over zero.

Figure 7:
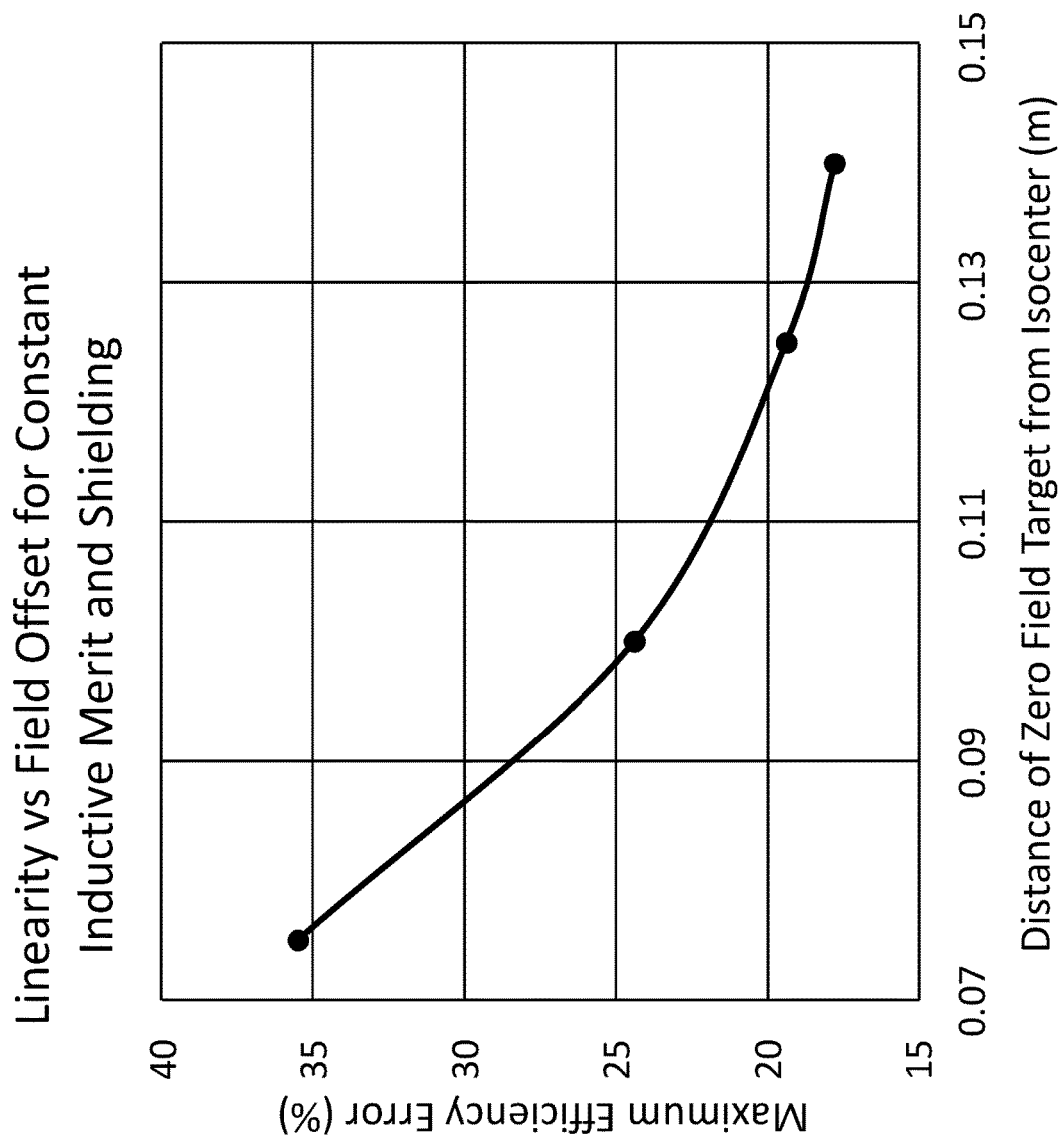
FIG. 7 is a graph illustrating the linearity versus field offset for constant inductive merit and shielding.
Figure 8:
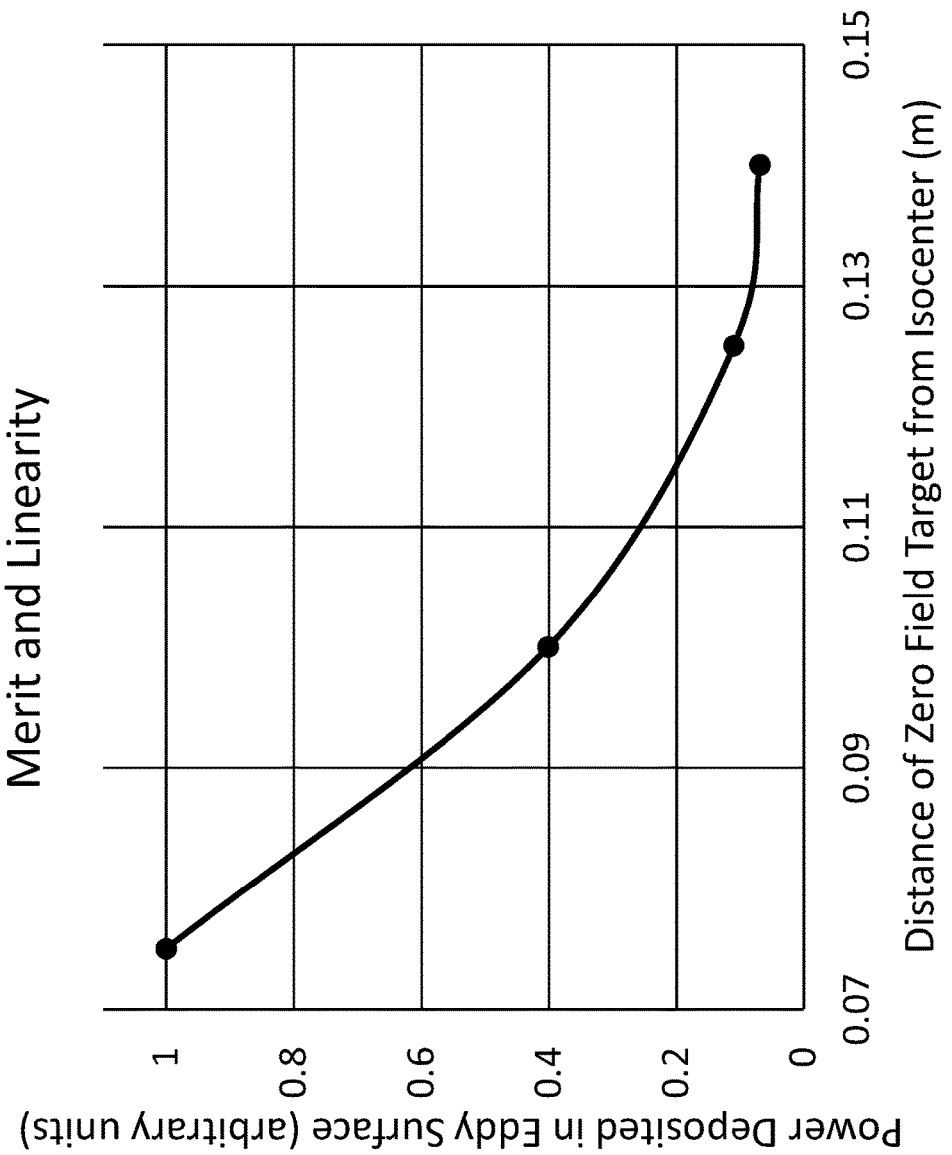
FIG. 8 is a graph illustrating the power deposited in eddy surface (leakage field) versus field offset for constant inductive merit and linearity.

By allowing the field produced by the z-gradient coil to have a small offset field, performance (i.e. efficiency, homogeneity) can be increased without the construction problems described above. As demonstrated in FIGS. 7 and 8, the offset also provides improvements in efficiency and power usage.

Asymmetric z-gradient coil 22 may have large net force if Lorentz forces aren't balanced. Thus, in addition, asymmetric z-gradient coil 22 may be further configured to be force balanced. The term "force balanced" means minimizing the net magnetic force that asymmetric z-gradient coil 22 may experience during a pulse. This balancing may be implemented in the design process of asymmetric z-gradient coil 22. It generally depends on the particular spatial variation of the magnetic field that asymmetric z-gradient coil 22 exists in for the magnet that the gradient is designed to go inside.

Asymmetric electromagnet system 10 may also comprise radiofrequency (RF) compensator 30. RF compensator 30 may form part of RF coil control unit 125, and be an active compensation circuit or software engine that is operatively coupled to RF coils 120 in the form of an RF transmitter and an RF receiver of MRI system 100. RF compensator 30 is configured to (de)modulate a frequency response of the RF transmitter when transmitting a pulse waveform, and then (re)modulate the frequency response of the RF receiver during signal reception to counteract the change in frequency to the main magnetic field caused by the gradient field offset. This allows the system to think that the Z gradient waveform is a symmetrical Z gradient.

In other words, the transmitter pulse adjusts the excitation so that the spins that are excited are in the same location as the spins that would be excited with a non-modulated RF transmit field working with a gradient field that has no offset. Thus, the RF transmitter modulation accounts for the offset.

The RF receiver then demodulates with the offset, such that the signal looks as if it were acquired with a standard gradient coil with no offset. In this way, the RF receiver "neutralizes" or counteracts the effect of the offset.

In some applications, to modulate the frequency response of the RF transmitter, RF compensator 30 may be configured to calculate a time-varying demodulation frequency based on timing, a known amount of gradient field offset per unit of control, and a gradient control waveform.

The time-varying control gradient waveform inputted into RF compensator 30 is typically the current waveform going to asymmetric z-gradient coil 22. The timing of the demodulation may be every microsecond. However, the timing input may be slower. The gradient field offset is measured or determined by either electromagnetic simulation, physical measurement with a field probe, or a combination of both (i.e. EM simulation followed by confirmation with physical measurement).

The time-varying demodulation frequency is then calculated from the input control waveform by a multiplicative factor which is determined in the offset measurement phase described above. In other words, RF compensator 30 needs to know the multiplicative factor that is determined in the calibration phase, that is, measurement of the amount of field offset per unit of control. The time-varying demodulation frequency is then calculated by multiplying the gradient waveform by the multiplicative factor.

For example, the signal may be multiplied by $e^{(i*2*pi*f*t)}$ where f is the frequency of the demodulation.

While creating the MRI pulse sequence, i.e. the set of instructions to the hardware needed to make an image, one can pre-compute the timing and amount of field offset that will occur and add this effect to the time-varying demodulation frequency of the RF transmit pulses and during RF signal reception. All of this may be done before the scan has occurred, i.e. is pre-computed.

In this manner, the calculated time-varying demodulation frequency may then be stored in memory 104. RF compensator 30 may be coupled to memory 104 in order to retrieve the time-varying demodulation frequency during imaging for transmission to the RF transmitter and the RF receiver. This approach is generally applied to the ideal gradient waveforms of a pulse sequence.

However, due to other calibrations, e.g. eddy current compensation and concomitant magnetic field correction, the final gradient waveforms (what is actually played out) will be a different shape and amplitude than the ideal gradient waveforms. Preferably, the correction for the gradient coil offset should be applied on what is actually played out, that is, on the final gradient waveforms, in order to be correct.

Thus, in other applications, RF compensator 30 may be configured to calculate the time-varying demodulation frequency in real-time during imaging. RF compensator 30 takes in the time-varying waveform that is configured with the gradient coil offsets (where the offsets are obtained via simulation, measurement, or calibration procedure), takes in the input time-varying gradient waveforms, and communicates to the RF transmitter and reception controllers the time-varying demodulation frequency in real-time. In this manner, as the gradient waveforms are being streamed to the amplifier, the calculation is done on the fly and the result sent to the RF transmitters and receivers. This approach is generally applied to the final gradient waveforms of a pulse sequence.

Another benefit of calculating the time-varying demodulation frequency in real-time is that the pulse sequence programmer can treat the system as an ideal gradient system without any magnetic field offsets.

In addition to asymmetric gradient coil 20 and RF compensator 30, symmetric electromagnet system 10 may include additional components for re-tuning the RF transmitter and RF receiver (not shown in the Figures).

For example, there could be communication link between RF compensator 30 and an active tuning board for the transmitter and/or reception systems. For volume RF transmitters, high-power varactor diodes provide ample tuning that maintains both field homogeneity and power efficiency. Local transmit coils can be dynamically tuned either at a distance or on-the-coil. For RF receivers, shunt capacitor banks actuated via low loss MEMS switches may be included to provide a low-noise option for dynamically adjusting the coil resonances. MEMS switches can be optically coupled to the compensator to mitigate EM interference and noise injection.

Figure 9:
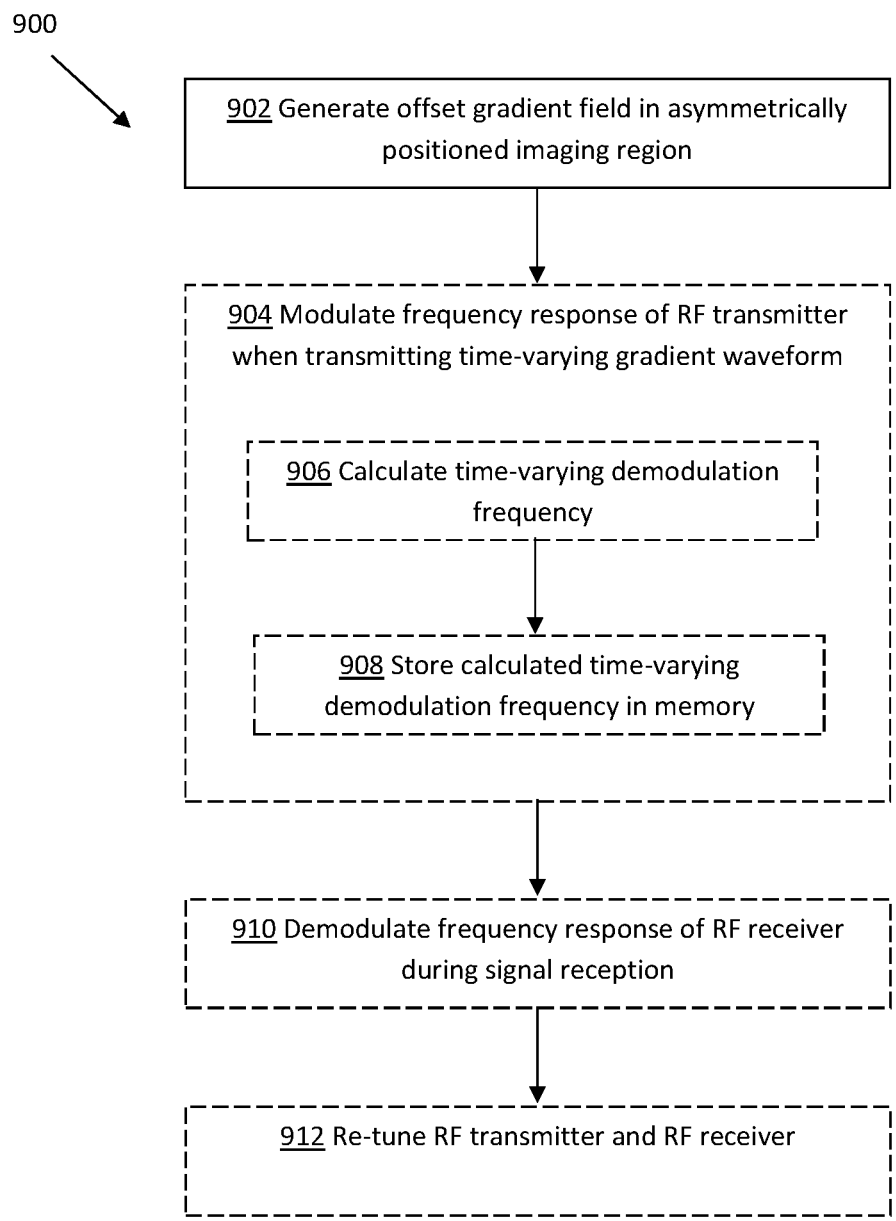
FIG. 9 is a flowchart setting forth the steps of an example method for generating an imaging magnetic field in an imaging region with an isocentre, where the imaging region is asymmetrically positioned.

Referring to FIG. 9, there is illustrated a method 900 for generating an imaging magnetic field in an imaging region with an imaging isocentre, the imaging region being asymmetrically positioned within a gradient coil bore inside a magnetic resonance imaging (MRI) system during imaging. In that regard, the present method is concerned with dynamically adjusting the frequency response of the RF transmit coil such that the transmit pulse waveform may not need to be changed.

In some examples, method 900 may be at least in part be performed using asymmetric electromagnet system 10 in MRI system 100 as shown in FIG. 1. Additionally, the following discussion of method 900 leads to further understanding of asymmetric electromagnet system 10. However, it is to be understood that asymmetric electromagnet system 10, and method 900, can be varied and need not work exactly as discussed herein in conjunction with each other, and that such variations are within the scope of the appended claims. As well, method 900 may be performed independently of asymmetric electromagnet system 10 and MRI system 100.

At 902, a gradient field is generated in the asymmetrically positioned imaging region, at least one gradient axis having the gradient field with a constant offset component whereby the position at which the gradient field passes through zero is offset with respect to the imaging isocentre of the asymmetrically positioned imaging region.

The gradient field generated may be shifted from the imaging isocentre along the z-axis. In particular, the gradient field may be generated with an offset between 5 cm to 20 cm, or preferably, between 7 cm to 15 cm from the imaging isocentre.

At 904, method 900 may further include modulating a frequency response of an RF transmitter when transmitting the time-varying gradient waveform.

The modulating may comprise calculating a time-varying demodulation frequency from timing, a known amount of gradient field offset per unit of control and an ideal gradient control waveform at 906, as described above.

In certain applications, the modulating may further comprise storing the calculated time-varying demodulation frequency in memory 104 for retrieval by RF compensator 30 during imaging at 908. In other applications, the modulating may comprise calculating the time-varying demodulation frequency in real-time during imaging.

At 910, method 900 may also include demodulating the frequency response of the RF receiver during signal reception. As the signal comes into the RF receiver, the signal is multiplied by $e^{\wedge}(i*2*pi*f*t)$ where f is the frequency of the demodulation.

Along with dynamically adjusting the demodulation frequency of the RF transmitter and receivers, at 912, the RF transmitter and receivers may also be dynamically re-tuned. This helps their efficiency, i.e. lowers power for transmit and higher SNR for receiver.

Figure 10:
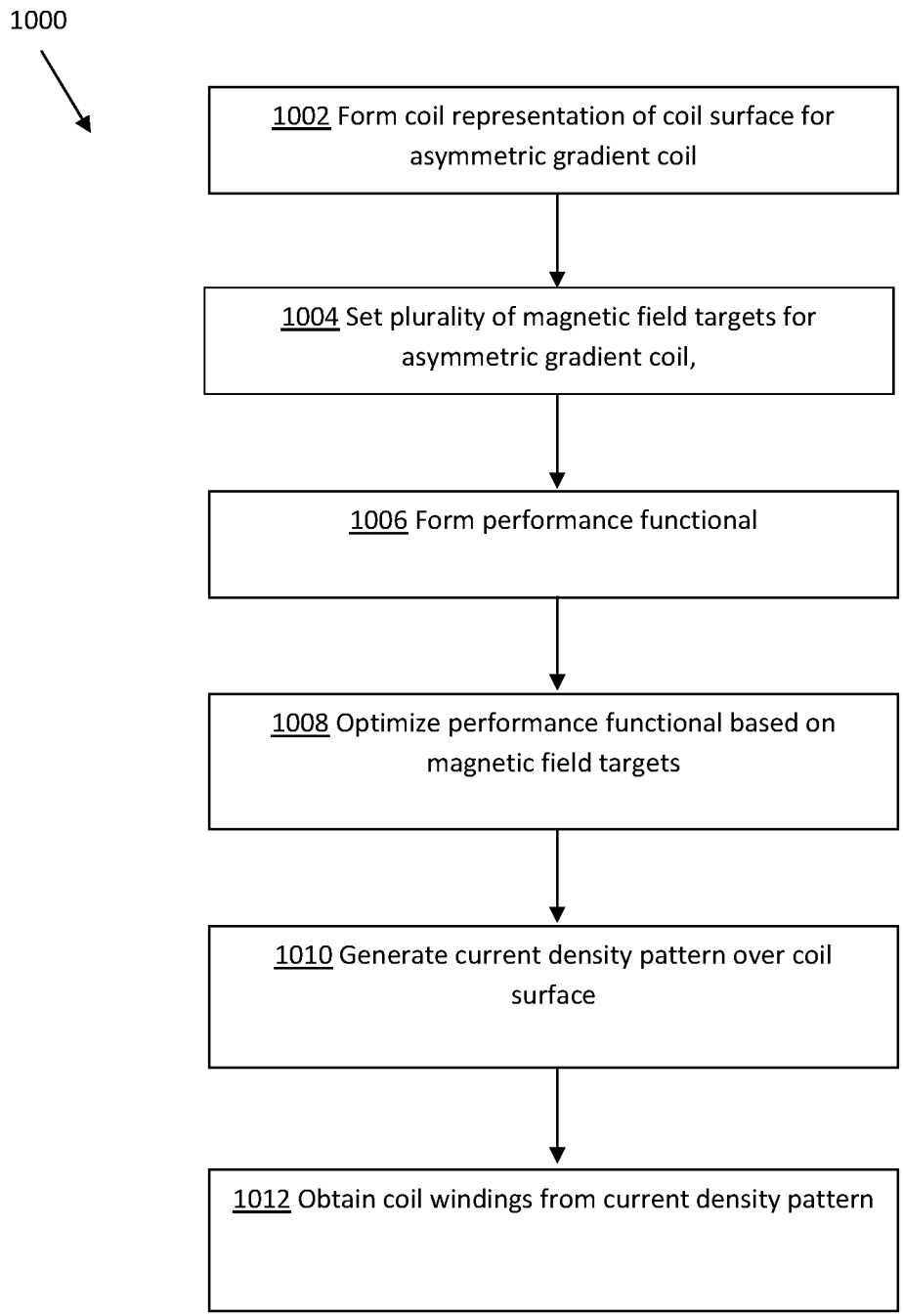
FIG. 10 is a flowchart setting forth the steps of an example method for producing the asymmetric gradient coil of FIG. 3.

Referring to FIG. 10, there is illustrated a method 1000 for manufacturing an asymmetric gradient coil for generating an imaging magnetic field in an imaging region with an imaging isocentre, the imaging region being asymmetrically positioned within a gradient coil bore inside a magnetic resonance imaging (MRI) system. This asymmetric gradient coil may be asymmetric gradient coil 20, and more particularly, asymmetric z-gradient coil 22.

The following discussion of method 1000 leads to further understanding of asymmetric gradient coil 20. However, it is to be understood that asymmetric gradient coil 20 and method 1000, can be varied and need not work exactly as discussed herein, and that such variations are within the scope of the appended claims.

At 1002, a coil representation of the coil surface for asymmetric gradient coil 20 is formed.

At 1004, a plurality of magnetic field targets is set for asymmetric gradient coil 20. The plurality of field targets may include at least one gradient axis having a gradient field with a constant offset component such that the position at which the gradient field passes through zero is offset with respect to the imaging isocentre of the asymmetrically positioned imaging region. The position at which the gradient field passes through zero may be shifted from the imaging isocentre along the z-axis. As well, the position at which the gradient field passes through zero may be shifted from the imaging isocentre by 5 cm to 20 cm, or preferably, by 7 cm to 15 cm.

At 1006, a performance functional may be formed. A performance functional is a set of design matrices that may be used to constrain design output. In the present embodiment, the performance functional is based on the coil representation and the plurality of magnetic field targets for generating a current density pattern over the coil surface. The performance functional may include a balancing of Lorentz forces.

At 1008, the performance functional is optimized based on the plurality of magnetic field targets.

At 1010, a current density pattern over the coil surface is generated based on the optimized performance functional.

At 1012, coil windings from the current density pattern are obtained. Asymmetric gradient coil 20 may then be produced therefrom. In this manner, asymmetric gradient coil 20 would be designed to generate an imaging magnetic field in an imaging region with an imaging isocentre, where the imaging region is asymmetrically positioned within a gradient coil bore inside a magnetic resonance imaging (MRI) system.

While some embodiments or aspects of the present disclosure may be implemented in fully functioning computers and computer systems, other embodiments or aspects may be capable of being distributed as a computing product in a variety of forms and may be capable of being applied regardless of the particular type of machine or computer readable media used to actually effect the distribution.

At least some aspects disclosed may be embodied, at least in part, in software. That is, some disclosed techniques and methods may be carried out in a computer system or other data processing system in response to its processor, such as a microprocessor, executing sequences of instructions contained in a memory, such as read-only memory (ROM), volatile random access memory (RAM), non-volatile memory, cache or a remote storage device.

A computer readable storage medium may be used to store software and data which when executed by a data processing system causes the system to perform various methods or techniques of the present disclosure. The executable software and data may be stored in various places including for example ROM, volatile RAM, non-volatile memory and/or cache. Portions of this software and/or data may be stored in any one of these storage devices.

Examples of computer-readable storage media may include, but are not limited to, recordable and non-recordable type media such as volatile and non-volatile memory devices, ROM, RAM, flash memory devices, floppy and other removable disks, magnetic disk storage media, optical storage media (e.g., compact discs (CDs), digital versatile disks (DVDs), etc.), among others. The instructions can be embodied in digital and analog communication links for electrical, optical, acoustical or other forms of propagated signals, such as carrier waves, infrared signals, digital signals, and the like. The storage medium may be the internet cloud, or a computer readable storage medium such as a disc.

Furthermore, at least some of the methods described herein may be capable of being distributed in a computer program product comprising a computer readable medium that bears computer usable instructions for execution by one or more processors, to perform aspects of the methods described. The medium may be provided in various forms such as, but not limited to, one or more diskettes, compact disks, tapes, chips, USB keys, external hard drives, wire-line transmissions, satellite transmissions, internet transmissions or downloads, magnetic and electronic storage media, digital and analog signals, and the like. The computer useable instructions may also be in various forms, including compiled and non-compiled code.

At least some of the elements of the systems described herein may be implemented by software, or a combination of software and hardware. Elements of the system that are implemented via software may be written in a high-level procedural language such as object oriented programming or a scripting language. Accordingly, the program code may be written in C, C++, J++, or any other suitable programming language and may comprise modules or classes, as is known to those skilled in object oriented programming. At least some of the elements of the system that are implemented via software and hardware may be written in assembly language, machine language or firmware as needed.

In either case, the program code can be stored on storage media or on a computer readable medium that is readable by a general or special purpose programmable computing device having a processor, an operating system and the associated hardware and software that is necessary to implement the functionality of at least one of the embodiments described herein. The program code, when read by the computing device, configures the computing device to operate in a new, specific and predefined manner in order to perform at least one of the methods described herein.

While the teachings described herein are in conjunction with various embodiments for illustrative purposes, it is not intended that the teachings be limited to such embodiments. On the contrary, the teachings described and illustrated herein encompass various alternatives, modifications, and equivalents, without departing from the described embodiments, the general scope of which is defined in the appended claims. Except to the extent necessary or inherent in the processes themselves, no particular order to steps or stages of methods or processes described in this disclosure is intended or implied. In many cases the order of process steps may be varied without changing the purpose, effect, or import of the methods described.

The invention claimed is:

1. An asymmetric electromagnet system for generating an imaging magnetic field in an imaging region with an imaging isocentre, the imaging region being asymmetrically positioned within a gradient coil bore inside a magnetic resonance imaging (MRI) system during imaging, the electromagnet system comprising:
   an asymmetric gradient coil configured to generate a gradient field in the asymmetrically positioned imaging region, at least one gradient axis having the gradient field with a constant offset component such that the position at which the gradient field passes through zero is offset with respect to the imaging isocentre of the asymmetrically positioned imaging region, wherein the asymmetric gradient coil includes an asymmetric z-gradient coil; and
   a radiofrequency (RF) compensator that is operatively coupled to an RF transmitter and an RF receiver of the MRI system, the RF compensator for modulating a frequency response of the RF transmitter when transmitting a pulse waveform, and of the RF receiver during signal reception to counteract for a change in frequency to a main magnetic field caused by the gradient field offset.

2. The electromagnet system of claim 1, wherein a winding density of the asymmetric z-gradient coil is lower than another winding density of another asymmetric z-gradient coil with zero offset, and configured to generate a gradient magnetic field at the imaging isocentre of the imaging region.

3. The electromagnet system of claim 1, wherein the gradient field is offset from the imaging isocentre between 7 cm to 15 cm.

4. The electromagnet system of claim 1, wherein the asymmetric gradient coil is further configured to be force balanced.

5. The electromagnet system of claim 1, wherein the RF compensator is configured to calculate a time-varying demodulation frequency based on timing, a known amount of gradient field offset per unit of control and a gradient control waveform.

6. The electromagnet system of claim 5, wherein the calculated time-varying demodulation frequency is stored in memory and the RF compensator is coupled to the memory to retrieve the time-varying demodulation frequency during imaging for transmission to the RF transmitter and the RF receiver.

7. The electromagnet system of claim 5, wherein the RF compensator is configured to calculate the time-varying demodulation frequency in real-time during imaging.

8. A method for generating an imaging magnetic field in an imaging region with an imaging isocentre, the imaging region being asymmetrically positioned within a gradient coil bore inside a magnetic resonance imaging (MRI) system during imaging, the method comprising:
generating a gradient field in the asymmetrically positioned imaging region, at least one gradient axis having the gradient field with a constant offset component whereby the position at which the gradient field passes through zero is offset with respect to the imaging isocentre of the asymmetrically positioned imaging region, wherein the gradient field generated is shifted from the imaging isocentre along the z-axis;
modulating a frequency response of an RF transmitter when transmitting a time-varying gradient waveform; and
demodulating a frequency response of an RF receiver during signal reception.

9. The method of claim 8, wherein the gradient field is generated with an offset between 7 cm to 15 cm from the imaging isocentre.

10. The method of claim 8, wherein the modulating comprises calculating a time-varying demodulation frequency from timing, a known amount of gradient field offset per unit of control and a gradient control waveform.

11. The method of claim 10, wherein the modulating further comprises storing the calculated time-varying demodulation frequency in memory for retrieval by an RF compensator during imaging.

12. The method of claim 10, wherein the modulating comprises calculating the time-varying demodulation frequency in real-time during imaging.

* * * * *